United States Patent
Lee

(10) Patent No.: US 9,203,410 B2
(45) Date of Patent: Dec. 1, 2015

(54) CIRCUIT FOR REDUCING ELECTROMAGNETIC INTERFERENCE NOISE

(75) Inventor: Jinseob Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 813 days.

(21) Appl. No.: 13/305,107

(22) Filed: Nov. 28, 2011

(65) Prior Publication Data

US 2012/0133453 A1  May 31, 2012

(30) Foreign Application Priority Data

Nov. 26, 2010 (KR) ........................ 10-2010-0119107

(51) Int. Cl.
 H04B 3/28 (2006.01)
 H03K 19/003 (2006.01)
 H03K 17/16 (2006.01)

(52) U.S. Cl.
 CPC ............................. H03K 19/00346 (2013.01)

(58) Field of Classification Search
 CPC .................................... H04B 3/28; H03H 7/38
 USPC ........ 333/12, 172, 1, 130, 131, 181; 315/247; 327/592
 See application file for complete search history.

(56) References Cited

U.S. PATENT DOCUMENTS

| | | | |
|---|---|---|---|
| 5,559,395 A * | 9/1996 | Venkitasubrahmanian et al. | 315/247 |
| 5,949,197 A * | 9/1999 | Kastner | 315/291 |
| 6,137,238 A * | 10/2000 | Alvarez et al. | 315/291 |
| 6,166,582 A | 12/2000 | Tseng et al. | |
| 6,184,730 B1 | 2/2001 | Kwong et al. | |
| 6,473,469 B1 * | 10/2002 | Leitch | 375/308 |
| 7,190,208 B2 * | 3/2007 | Ribarich et al. | 327/423 |
| 7,432,732 B2 * | 10/2008 | Komatsu et al. | 326/37 |
| 2009/0261743 A1 * | 10/2009 | Chen et al. | 315/192 |
| 2013/0265118 A1 * | 10/2013 | Liu et al. | 333/131 |
| 2014/0009238 A1 * | 1/2014 | Mo et al. | 333/1 |
| 2014/0009243 A1 * | 1/2014 | Mo et al. | 333/100 |
| 2014/0009246 A1 * | 1/2014 | Mo et al. | 333/131 |

FOREIGN PATENT DOCUMENTS

| | | |
|---|---|---|
| CN | 201115260 Y | 9/2008 |
| CN | 101488712 A | 7/2009 |
| CN | 101510722 A | 8/2009 |
| CN | 101860196 A | 10/2010 |
| JP | H-04-030567 A | 2/1992 |
| JP | 2006-303377 A | 11/2006 |

(Continued)

OTHER PUBLICATIONS

European Search Report dated Jan. 23, 2012 in European Application No. 11190525.3.

(Continued)

*Primary Examiner* — Dean Takaoka
(74) *Attorney, Agent, or Firm* — Saliwanchik, Lloyd & Eisenschenk

(57) ABSTRACT

Disclosed is a circuit for reducing EMI noise in a driver IC including at least one or more input ports, and at least one or more output ports, the circuit including a power unit connected to any one of the input ports to output a current to the driver IC, and at least one or more resistors arranged in series between the at least one or more output ports of the driver IC and an output terminal connecting an exterior device operated by the driver IC.

2 Claims, 3 Drawing Sheets

(56) References Cited

FOREIGN PATENT DOCUMENTS

JP     2008-147338 A     6/2008
JP     2010-232606 A     10/2010

OTHER PUBLICATIONS

Office Action dated Jan. 15, 2014 in European Application No. 11190525.3.

Wikipedia, "Decoupling Capacitor," Nov. 11, 2010.

Kundert, Ken. "Power Supply Noise Reduction," Jan. 2004, pp. 1-12, Version 4. The Designer's Guide Community.

Office Action dated Dec. 23, 2014 in Chinese Application No. 201110382050.7.

Japanese Office Action dated Sep. 29, 2015 in Japanese Application No. 2011-259416.

* cited by examiner

CIRCUIT FOR REDUCING ELECTROMAGNETIC INTERFERENCE NOISE

CROSS-REFERENCE TO RELATED APPLICATION

This application claims the benefit under U.S.C. §119 of Korean Application No. 10-2010-0119107, filed Nov. 26, 2010, which is hereby incorporated by reference in its entirety.

BACKGROUND

1. Field of the Disclosure

The present disclosure relates to a noise-reducing circuit, and more particularly to a circuit for reducing EMI (Electromagnetic Interference) noise for use in a power unit of a driver IC (Integrated Circuit).

2. Discussion of the Related Art

EMI noise refers to a noise that generates a problem caused by interference when an electromagnetic (EM) wave created in one electrical circuit, component or part is transferred to another electrical circuit, component or part.

As the operating frequencies of electric products become higher, electromagnetic interference (EMI) has been perceived as a chronic noise problem. Particularly, the operating frequencies of electronic products have reached a few ten megahertz (MHz), or even a few gigahertz (GHz), making the EMI problems more troublesome and serious. Subsequently, an object of finding a solution to the problems is desperately needed.

FIG. 1 is a circuit diagram illustrating a power unit for supplying a power to a driver IC according to prior art and an output unit thereof.

Referring to FIG. 1, a power unit (10) for supplying a power to a driver IC (30) is configured in such a manner that capacitors C1 to C4 for decoupling are connectively interposed between a power input unit (11) and a ground GND. The capacitors C1 to C4 for decoupling are to charge or discharge low frequency or high frequency AC (Alternating Current) components of a current supplied from the power input unit (11).

An output terminal of the driver IC (30) is 'A' in FIG. 1, and a signal inputted from the power unit (10) is outputted to the output terminal A through the driver IC (30).

However, the driver IC (30) thus configured is problematic in that EMI noise such as PWM (Pulse Width Modulation) noise or low frequency noise due to capacitor capacity is inputted to the output terminal A.

BRIEF SUMMARY

The present disclosure is directed to cope with the above-mentioned problems and disadvantages and it is an object of the present disclosure to provide a circuit for reducing EMI (Electromagnetic Interference) configured to reduce EMI noise of an output circuit in a driver IC (Integrated Circuit) by arranging resistors in series at an output terminal of the driver IC.

Technical problems to be solved by the present disclosure are not restricted to the above-mentioned description, and any other technical problems not mentioned so far will be clearly appreciated from the following description by the skilled in the art.

In one general aspect of the present disclosure, there is provided a circuit for reducing an EMI noise in a driver IC including at least one or more input ports, and at least one or more output ports, the circuit comprises a power unit connected to any one of the input ports to output a current to the driver IC; and at least one or more resistors arranged in series between the at least one or more output ports of the driver IC and an output terminal connecting an exterior device operated by the driver IC.

In another general aspect of the present disclosure, there is provided a circuit for reducing an EMI noise inputted to output ports in a driver IC driving an outside device by including input ports, and the at least one or more output ports, the circuit comprises at least one or more resistors arranged in series between the at least one or more output ports of the driver IC and an output terminal connecting the exterior device.

The circuit for reducing EMI noise thus configured according to the present disclosure is advantageous in that an overall noise level in high frequency (30 MHz~108 MHz) can be reduced to obtain a sufficient margin by serially connecting respective resistors to output ports of a driver IC.

BRIEF DESCRIPTION OF THE DRAWINGS

The accompanying drawings, which are included to provide a further understanding of the present disclosure, and are incorporated in the present disclosure and constitute a part of this application, and together with the description, serve to explain the principle of the disclosure. In the drawings.

DETAILED DESCRIPTION

Figure 1:
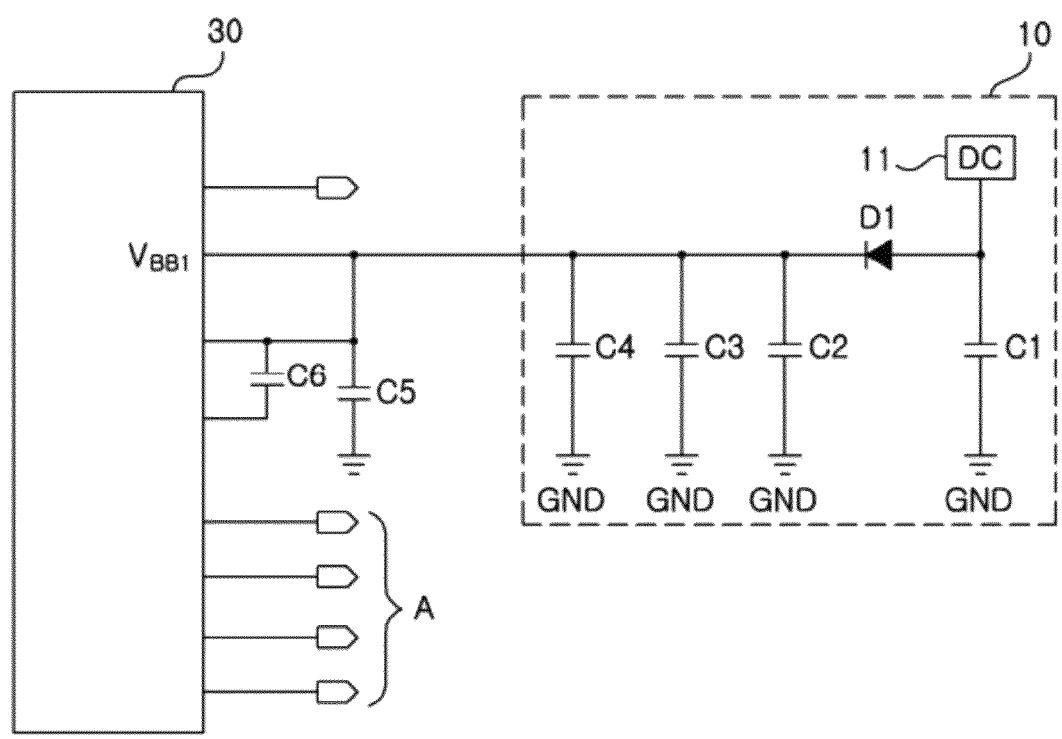
FIG. 1 is a circuit diagram illustrating a power unit for supplying a power to a driver IC according to prior art and an output unit thereof.

Advantages and features of the present invention may be understood more readily by reference to the following detailed description of exemplary embodiments and the accompanying drawings. Detailed descriptions of well-known functions, configurations or constructions are omitted for brevity and clarity so as not to obscure the description of the present disclosure with unnecessary detail. Thus, the present disclosure is not limited to the exemplary embodiments which will be described below, but may be implemented in other forms. In the drawings, the width, length, thickness, etc. of components may be exaggerated or reduced for the sake of convenience. Furthermore, throughout the descriptions, the same reference numerals will be assigned to the same elements in the explanations of the figures, and explanations that duplicate one another will be omitted.

Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

The terms "first," "second," and the like, herein do not denote any order, quantity, or importance, but rather are used to distinguish one element from another, and the terms "a"

and "an" herein do not denote a limitation of quantity, but rather denote the presence of at least one of the referenced item.

As will be appreciated by one of skill in the art the order of blocks and processes in the foregoing aspects may be performed in any order. Words such as "thereafter," "then," "next," etc. are not intended to limit the order of the processes; these words are simply used to guide the reader through the description of the methods.

All features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with others of the embodiments.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements.

As may be used herein, the terms "substantially", "substantial" and "approximately" provide an industry-accepted tolerance for its corresponding term and/or relativity between items. Such an industry-accepted tolerance ranges from less than one percent to ten percent and corresponds to, but is not limited to, component values, angles, et cetera. Such relativity between items ranges from less than one percent to ten percent.

Now, a circuit for reducing EMI noise according to the exemplary embodiments of the present disclosure will be described in detail with reference to the accompanying drawings.

Figure 2:
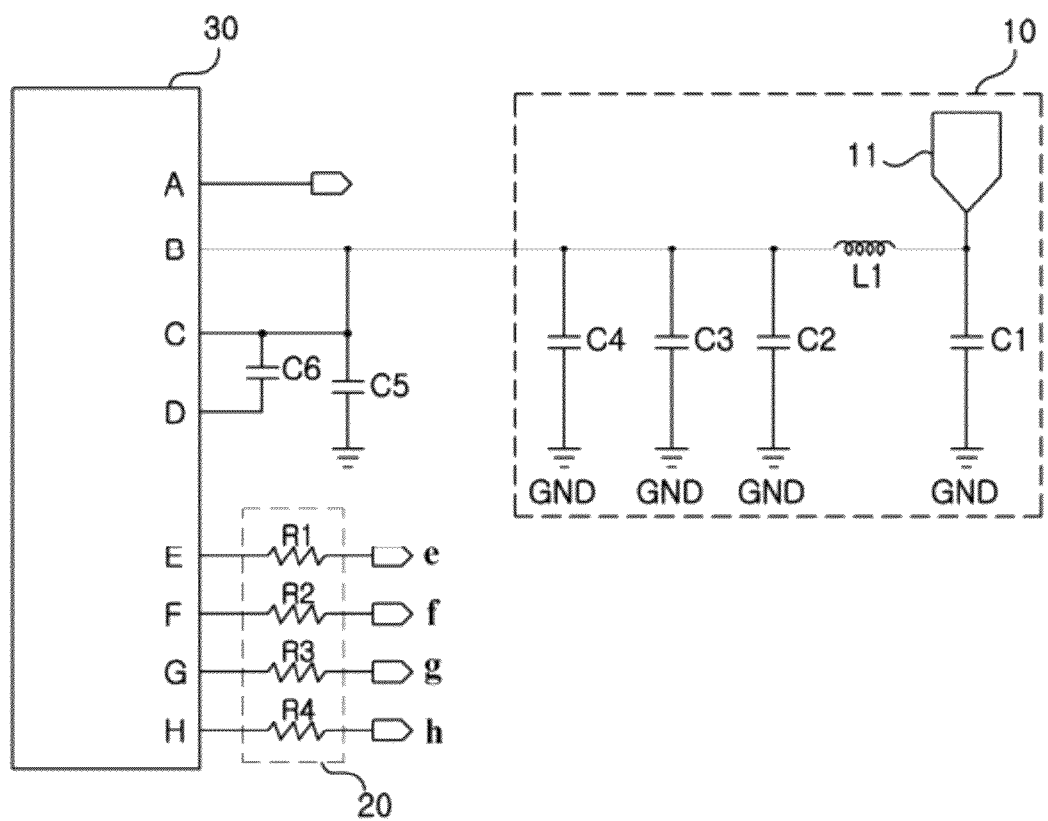
FIG. 2 is an EMI noise reducing circuit according to an exemplary embodiment of the present disclosure.

FIG. 2 is an EMI noise reducing circuit according to an exemplary embodiment of the present disclosure.

Referring to FIG. 2, the EMI noise reducing circuit according to an exemplary embodiment of the present disclosure includes a power unit (10), and a driver IC (30), where a port A of the driver IC (30) is a null port, ports B, C and D are input ports, and ports E, F, G and H are output ports. That is, the drive IC (30) is such that a signal inputted from the power unit (10) is forthrightly received by the port B, and signals for driving a motor and the like are respectively outputted to the ports E, F, G and H.

The power unit (10) is such that capacitors C1, C2, C3 and C4 for decoupling are connected between a power input unit (11) and a ground GND. The capacitors C1, C2, C3 and C4 for decoupling charge or discharge a low frequency or high frequency AC (Alternating Current) components of current supplied from the power input unit (11). To be more specific, the current inputted from the power input unit (11) passes the capacitor C2 filtering the low frequency noise, and passes the capacitors C3 and C4 filtering the high frequency noise. Preferably, C2 has a value of 10 nF/25V, and C3 and C4 have 220 nF/50V and 10 nF/25V respectively.

Capacitors C5 and C6 connected to other input ports of the driver IC (30) inhibits oscillation of input current, and preferably, have 10 nF and 220 nF respectively. To be more specific, the capacitor C5 is connected between the power unit and the ground, and the capacitor C6 is connected between the capacitor C5 and the port D. Furthermore, the capacitor C5 is also connected to port C.

Further, the EMI reducing circuit according to the present disclosure is configured in such a manner that resistors are respectively connected between the output ports E, F, G and H of the driver IC (30) and output terminals e, f, g and h that connect signals outputted from the output ports to outside devices, where a resistor R1 (connected between the output port E and output terminal e), a resistor R2 (connected between the output port F and the output terminal f), a resistor R3 (connected between output port G and output terminal g) and a resistor R4 (connected between the output port H and the output terminal h) are commonly referred to as a resistor unit (20).

Each resistor R1, R2, R3 and R4 of the resistor unit (20) preferably has 36Ω, or 20Ω. Alternatively, each resistor R1, R2, R3 and R4 of the resistor unit (20) may have a same resistance value or may have a mutually different resistance value. However, it should be noted that the exemplary embodiment of the present disclosure is not limited to the given values.

Although the number of output terminals in the driver IC (30) is restricted to 4 in the exemplary embodiment of the present disclosure, the number of output terminals is not limited thereto. Thus, the number of resistors connected to the output terminals is not restricted to 4 in the exemplary embodiment of the present disclosure. Therefore, noises inputted through the output terminals e, f, g and h can be interrupted by the EMI noise reducing circuit according to the present disclosure.

Figure 3:
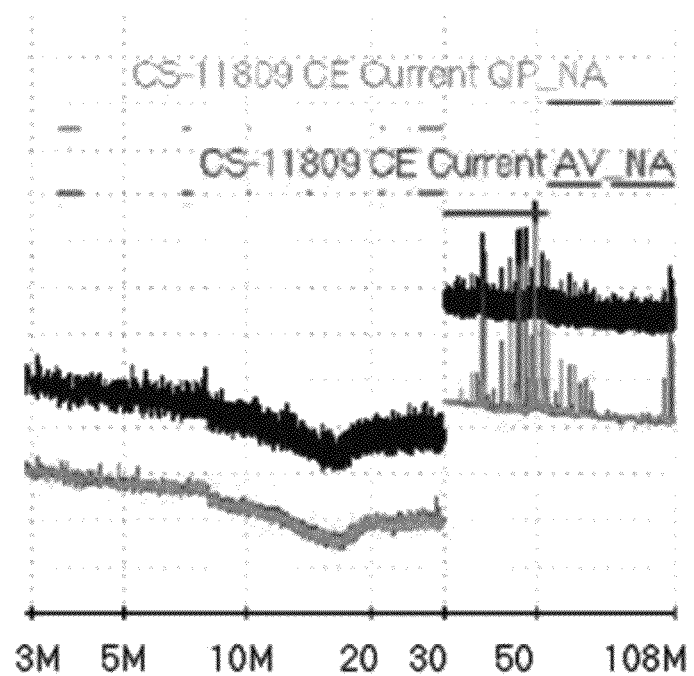
FIG. 3 is a schematic view illustrating a measurement of an output noise in the circuit of FIG. 1.

FIG. 3 is a schematic view illustrating a measurement of an output noise in the circuit of FIG. 1.

Referring to FIG. 3, it is noted that noises are abundant on the whole, and there generates a limit-over for some bands. A red line in FIG. 3 refers to a limit line to a peak for a relevant band, and a pink line is a limit line to an average for a relevant band. At this time, a value in which the limit line to the peak is subtracted by the peak is defined as a 'margin', and a frequency band where there generates the limit-over by the peak being greater than the limit line, is present in FIG. 3, which corresponds to generation of a serious EMI noise. Furthermore, it is difficult to obtain a generally acceptable margin for the overall band.

Figure 4:
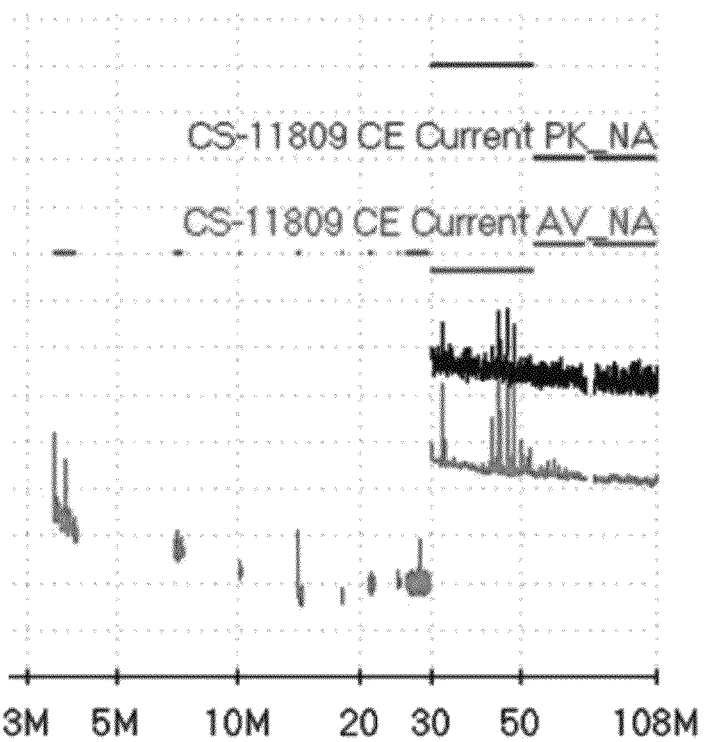
FIG. 4 is an exemplary view illustrating a measurement of output noise of the circuit of FIG. 2 attached with an EMI noise reducing circuit according to an exemplary embodiment of the present disclosure.

FIG. 4 is an exemplary view illustrating a measurement of output noise of the circuit of FIG. 2 comprising an EMI noise reducing circuit according to an exemplary embodiment of the present disclosure, where outputs were measured in which each resistance of the resistor unit (20) is given as 20Ω.

Referring to FIG. 4, the EMI noise reducing circuit according to the exemplary embodiment of the present disclosure is such that in comparison with FIG. 3, there is noticeably no frequency band where the limit-over is generated, and an entire frequency band is where the limit-in is present. That is, a margin is approximately 2 dB in the circuit of FIG. 3, such that it is difficult to obtain a sufficient margin, but a sufficient margin of an approximately 10 dB can be obtained in the circuit of FIG. 4 according to the EMI noise reducing circuit of the exemplary embodiment of the present disclosure.

As apparent from the foregoing, the EMI noise reducing circuit of the exemplary embodiment of the present disclosure has an industrial applicability in that an overall noise level can be reduced in the high frequency bands (30 MHz~108 MHz) to obtain a sufficient margin.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A circuit for reducing an EMI noise in a driver IC including one or more input ports, and one or more output ports, the circuit comprising:

a power unit connected to any one of the input ports to output a current to the driver IC; and one or more resistors arranged in series between the one or more output ports of the driver IC and an output terminal connecting an exterior device operated by the driver IC, wherein the driver IC has at least two input ports and two of the input ports of the driver IC inhibit oscillation of the current inputted from the power unit, wherein the power unit comprises:

a power input unit;

a first capacitor unit connectively interposed between the power input and a ground for filtering a low frequency noise component of the current inputted from the power input unit; and a second capacitor unit connectively interposed between the power input unit and the ground for filtering a high frequency component of the current inputted from the power input unit.

2. The circuit of claim 1, wherein the one or more resistors comprises a plurality of resistors having mutually different values.

* * * * *